(12) United States Patent
Matsumori

(10) Patent No.: US 7,737,030 B2
(45) Date of Patent: Jun. 15, 2010

(54) METHOD FOR MANUFACTURING A SEMICONDUCTOR DEVICE, AND SAID SEMICONDUCTOR DEVICE

(75) Inventor: Hisakazu Matsumori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 117 days.

(21) Appl. No.: 12/113,273

(22) Filed: May 1, 2008

(65) Prior Publication Data

US 2008/0277788 A1 Nov. 13, 2008

(30) Foreign Application Priority Data

May 8, 2007 (JP) ............................. 2007-123270

(51) Int. Cl.
*H01L 21/584* (2006.01)
(52) U.S. Cl. ................ 438/653; 438/637; 257/E21.584
(58) Field of Classification Search .................. 438/653, 438/637, 638, 640, 643, 672, 675, 681
See application file for complete search history.

(56) References Cited

U.S. PATENT DOCUMENTS 6,528,409 B1 3/2003 Lopatin et al.

6,812,133 B2 * 11/2004 Takeuchi ..................... 438/623
6,861,347 B2 3/2005 Lee et al.
6,952,052 B1 10/2005 Marathe et al.
2007/0037385 A1 * 2/2007 Huebinger et al. .......... 438/638

FOREIGN PATENT DOCUMENTS

JP 2006-5010 1/2006

* cited by examiner

*Primary Examiner*—Phat X Cao
*Assistant Examiner*—Nga Doan
(74) *Attorney, Agent, or Firm*—Finnegan, Henderson, Farabow, Garrett & Dunner, L.L.P.

(57) ABSTRACT

A method for manufacturing a semiconductor device has forming a first metal wire in a groove formed in an insulating film on a semiconductor substrate, forming an interlayer dielectric on the insulating film and the first metal wire, forming a via hole by etching the interlayer dielectric, forming a first barrier metal on sidewalls of the via hole, forming an organic film in the via hole having the first barrier metal formed therein, etching the first barrier metal exposed by performing an etchback on the organic film to a predetermined position, forming a trench integrally with an upper portion of the via hole by etching the interlayer dielectric to a predetermined position, forming a second barrier metal on the first barrier metal and sidewalls of the trench in the via hole, after the organic film remaining in the via hole is removed, and forming a second metal wire in the via hole and the trench having the second barrier metal formed therein.

11 Claims, 13 Drawing Sheets

US 7,737,030 B2

METHOD FOR MANUFACTURING A SEMICONDUCTOR DEVICE, AND SAID SEMICONDUCTOR DEVICE

CROSS-REFERENCE TO RELATED APPLICATION

This application is based upon and claims the benefit of priority from the prior Japanese Patent Application No. 2007-123270, filed on May 8, 2007; the entire contents of which are incorporated herein by reference.

BACKGROUND OF THE INVENTION

The present invention relates to a method for manufacturing a semiconductor device, and also relates to the semiconductor device. More particularly, the present invention relates to a method for manufacturing a semiconductor device having wires formed by a dual damascene process, and also relates to the semiconductor device.

As a process for forming wires of a semiconductor device, there has been a via-first dual damascene process that involves a low-k interlayer dielectric (a low dielectric constant film (a low-k film)). In this dual damascene process, a single damascene wire is formed on an insulating film, with a barrier metal being interposed between the single damascene wire and the insulating film. The low-k film such as a SiOC composition film is formed on the single damascene wire. A via hole is formed in the low-k film on the single damascene wire, and a wire groove is formed on the via hole. A wiring metal material is then provided to fill the via hole and the wire groove via a barrier metal. In the process of forming the via hole, the low-k film is etched by a resist processing technique and the reactive ion etching (RIE) technique, and the resist is removed by the Asher technique.

During the RIE process, however, the surface of the low-k film is exposed to a plasma atmosphere. As a result, the carbon (C), the methyl group ($CH_3$), or the aryl group (CH substituent) in the low-k film are desorbed, and a SiO film is formed on the surface of the etched low-k film. Exposed to the air, the SiO film absorbs moisture to form a damaged layer (a SiOH layer) on the surface of the etched low-k film. The barrier metal reacts with the OH group in the damaged layer, to form an oxide film on the surface of the barrier metal. The oxide film lowers the reliability of the wires. During the Asher process, a damaged layer is also formed.

In a case where the damaged layer is removed by wet etching with the use of a chemical solution containing a HF-based substance, the low-k film is deformed by the amount corresponding to the removed damaged layer. As a result, a width of the trench (particularly, the via diameter) becomes greater, and hinders miniaturization of the semiconductor device.

As described above, by the conventional semiconductor device manufacturing process, it is difficult to increase a reliability of the wire and prevent an increase in a width of the trench during the dual damascene process (Japanese Patent Application Laid-Open No. 2006-5010).

SUMMARY OF THE INVENTION

According to the first aspect of the present invention, there is provided that a method for manufacturing a semiconductor device, comprising:

forming a first metal wire in a groove formed in an insulating film on a semiconductor substrate;

forming an interlayer dielectric on the insulating film and the first metal wire;

forming a via hole by etching the interlayer dielectric;

forming a first barrier metal on sidewalls of the via hole;

forming an organic film in the via hole having the first barrier metal formed therein;

etching the first barrier metal exposed by performing an etchback on the organic film to a predetermined position;

forming a trench integrally with an upper portion of the via hole by etching the interlayer dielectric to a predetermined position;

forming a second barrier metal on the first barrier metal and sidewalls of the trench in the via hole, after the organic film remaining in the via hole is removed; and forming a second metal wire in the via hole and the trench having the second barrier metal formed therein.

According to the second aspect of the present invention, there is provided that a semiconductor device comprising:

an insulating film that is formed on a semiconductor substrate;

a first metal wire that is formed on a surface of the insulating film;

an interlayer dielectric that is formed on the insulating film and the first metal wire;

a second metal wire that is formed in the interlayer dielectric and on the first metal wire; and first and second barrier metals that are formed between the second metal wire and the interlayer dielectric.

DETAILED DESCRIPTION OF THE INVENTION

Referring to FIGS. 1 to 6, a dual damascene process by which a via is formed on a semiconductor element placed on a silicon substrate is described.

Figure 1:
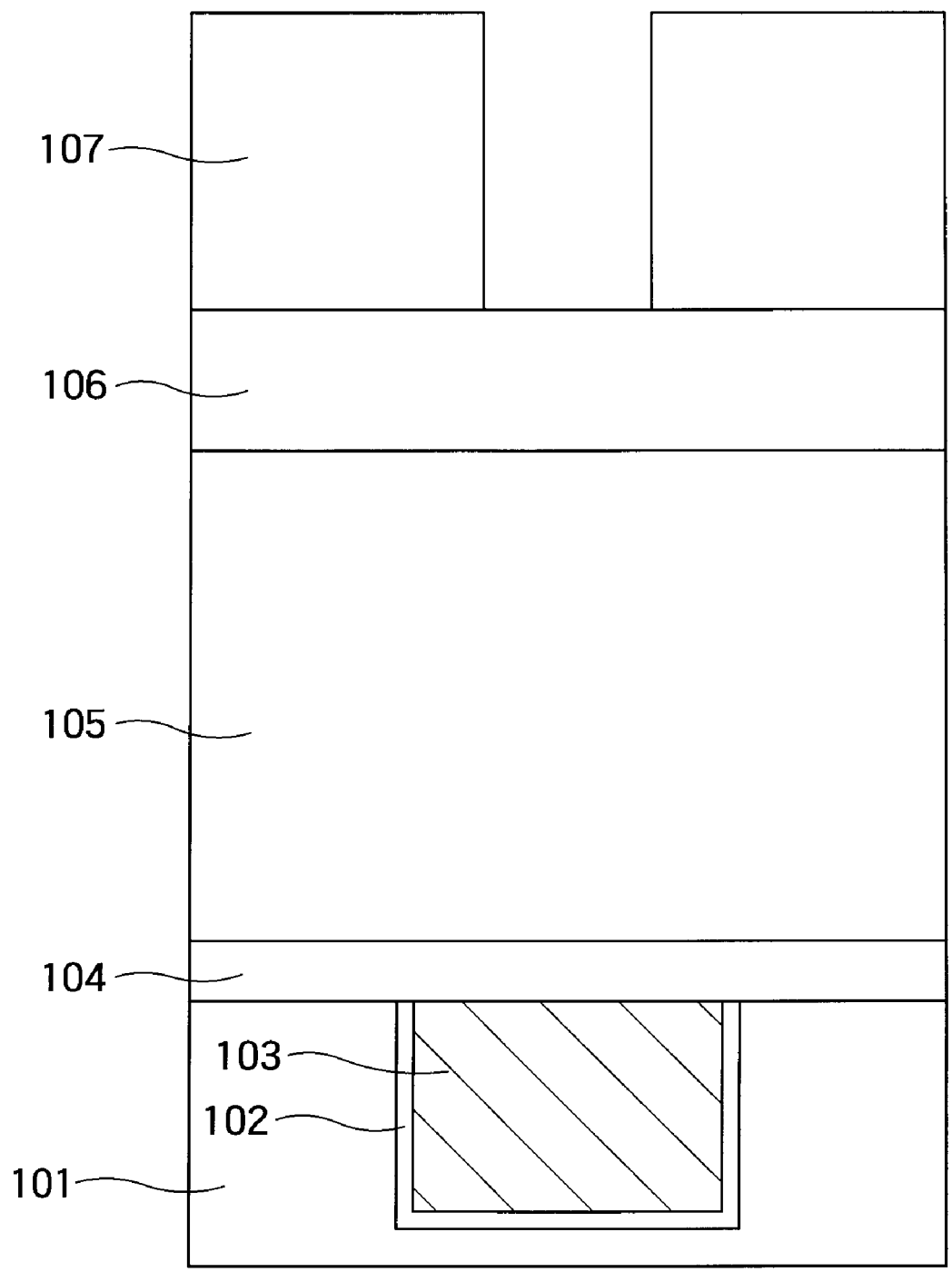
FIG. 1 is a cross-sectional view showing a process in a dual damascene process.

FIG. 1 is a cross-sectional view showing a process in the dual damascene process.

First, an insulating film 101 is formed on a contact hole (not shown) continuing to the semiconductor element. A trench pattern is then formed by a photolithography technique and an etching technique, so as to form a trench to bury a later described first metal wire (a Cu single damascene wire 103).

A lower-layer wiring barrier metal 102 is formed inside the trench and on the entire surface of the insulating film 101 by a sputtering technique.

A wiring material (such as Cu) is formed on the entire surface of the lower-layer wiring barrier metal 102 by a sputtering technique or a plating technique, so as to fill the trench. The portions of the lower-layer wiring barrier metal 102 and the Cu existing outside the trench are removed by the chemical mechanical polishing (CMP) technique, so as to form the first metal wire (the Cu single damascene wire) 103.

A diffusion preventing film (a SiCN film) 104 is then formed on the first metal wire (the Cu single damascene wire) 103.

An interlayer dielectric (a low-k film) 105 such as a SiOC composition film is then formed on the diffusion preventing film (the SiCN film) 104.

A TEOS film (a silicon insulating film) 106 is then formed as a low-k film capping material on the interlayer dielectric (the low-k film) 105.

A first resist film 107 is then formed on the TEOS film (the silicon insulating film) 106, and a via pattern is formed by a photolithography technique.

Figure 2:
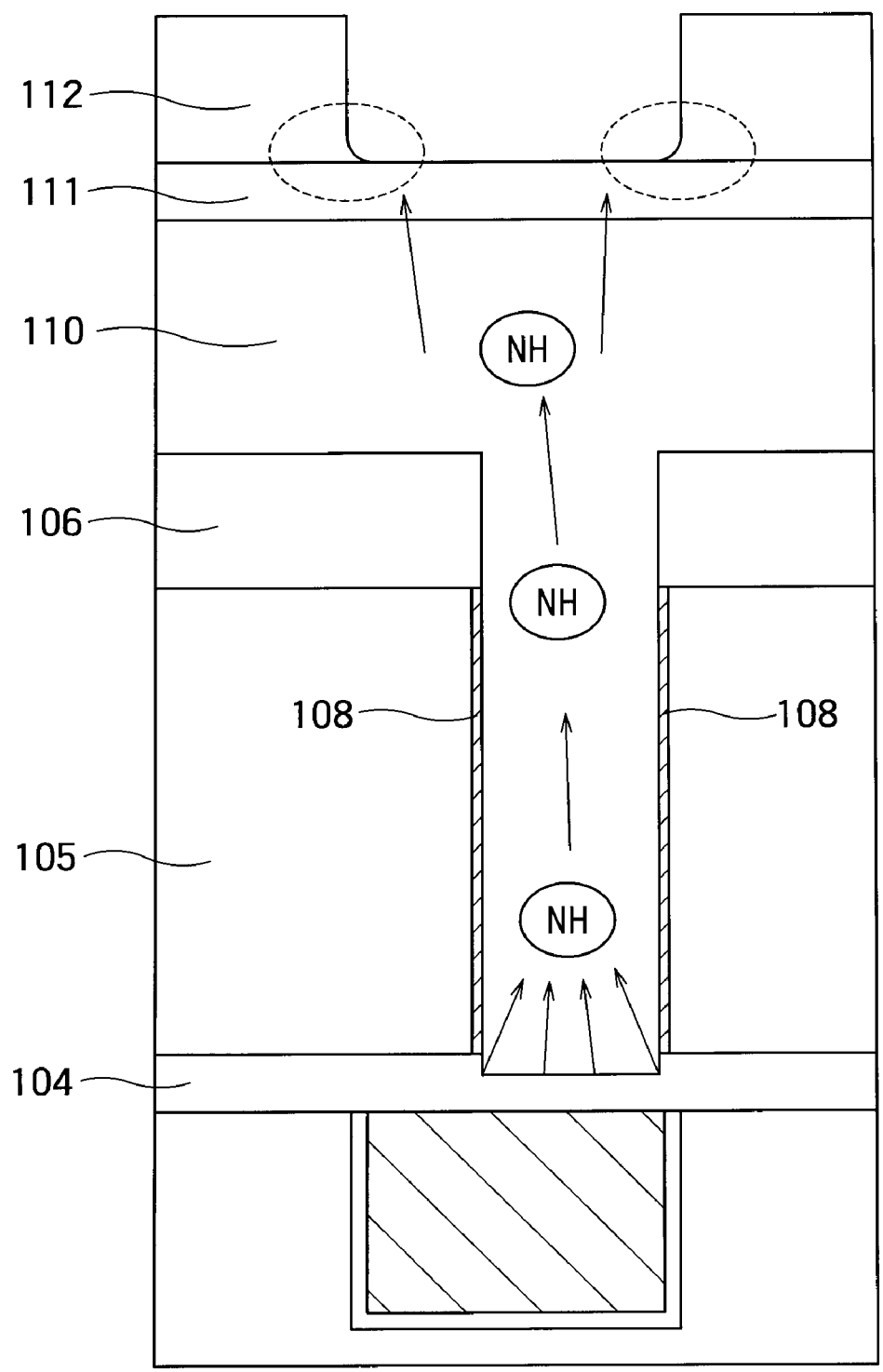
FIG. 2 is a cross-sectional view showing the process following the process shown in FIG. 1 in the dual damascene process.

FIG. 2 is a cross-sectional view showing the process following the process shown in FIG. 1 in the dual damascene process.

After the via pattern is formed by a photolithography technique, etching is performed on the TEOS film 106 and the interlayer dielectric (the low-k film) 105 by RIE, so as to form a via hole. The first resist film 107 used as a mask is then removed by the Asher technique. During the RIE process, the interlayer dielectric (the low-k film) 105 is exposed to a plasma atmosphere, and a SiO layer is formed on the inner faces of the via hole. As the SiO layer absorbs moisture, a damaged layer (a SiOH layer) 108 is formed on the inner faces of the via hole. During the Asher process, the damaged layer (the SiOH layer) 108 on the surface of the interlayer dielectric (the low-k film) 105 is also formed.

Spin coating is then performed to form an organic film 110 that fills the via hole, and an inorganic film 111 is formed on the organic film 110.

A second resist 112 is next formed on the inorganic film 111, and a trench pattern is formed by a photolithography technique. At this point, the amine group (NH) generated from the surface of the diffusion preventing film (the SiCN film) 104 exposed by RIE forms skirt portions on the second resist 112 (see the portions indicated by the broken lines in FIG. 2). The amine group (NH) leaves unresolved portions in a photolithography process of an oxidation enhancing type.

Figure 3:
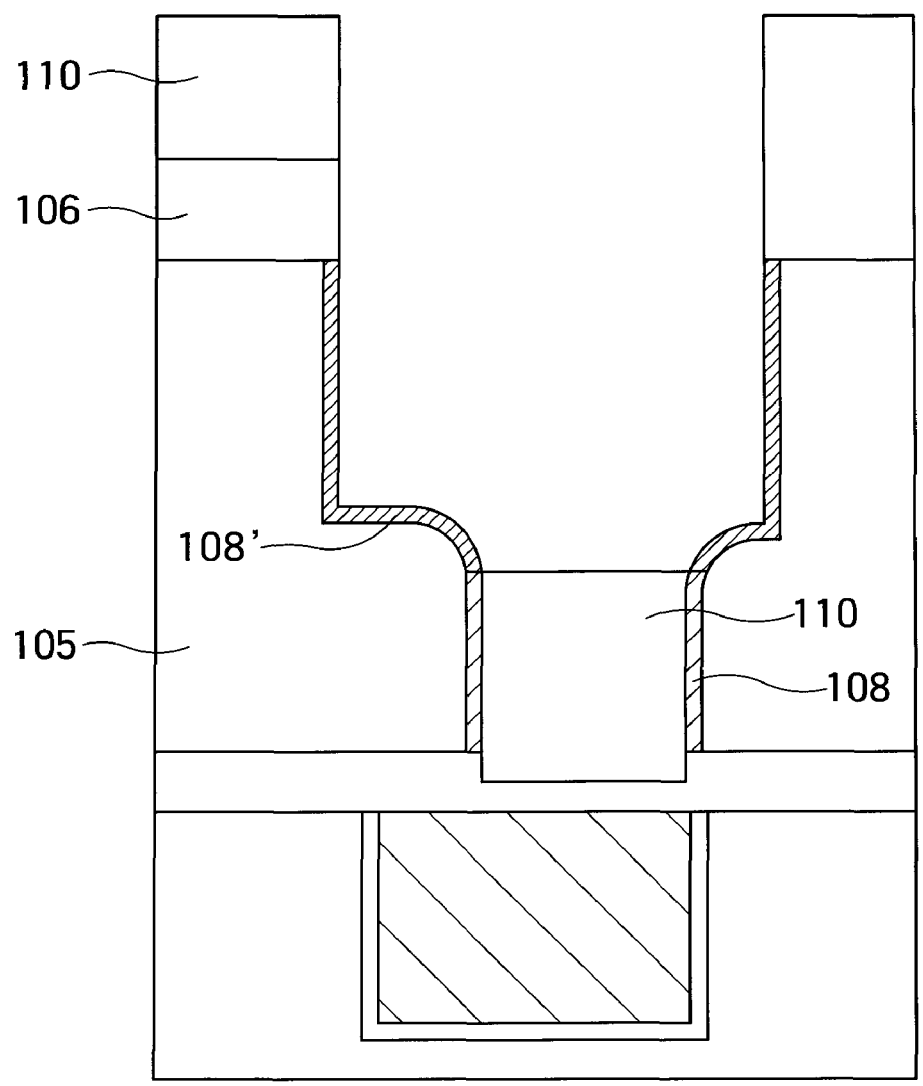
FIG. 3 is a cross-sectional view showing the process following the process shown in FIG. 2 in the dual damascene process.

FIG. 3 is a cross-sectional view showing the process following the process shown in FIG. 2 in the dual damascene process.

After the trench pattern is formed by a photolithography technique, etching is performed on the inorganic film 111, the organic film 110, the TEOS film (the silicon insulating film) 106, and the interlayer dielectric (the low-k film) 105 by RIE. At the time of etching of the TEOS film (the silicon insulating film) 106 and the interlayer dielectric (low-k) film 105, etching is also performed on the organic film 110 filling the via hole. Also, at the time of etching of the interlayer dielectric (the low-k film) 105, half-etching which is stopped halfway is performed, and a trench for burying a later described second metal wire (a Cu dual damascene wire) 115 is formed. At this point, the damaged layer (the SiOH layer) 108 shown in FIG. 2 in the interlayer dielectric (the low-k film) 105 is removed, but another damaged layer (a SiOH layer) 108' exposed to a plasma atmosphere and the air or the like is formed in the same manner as above.

Figure 4:
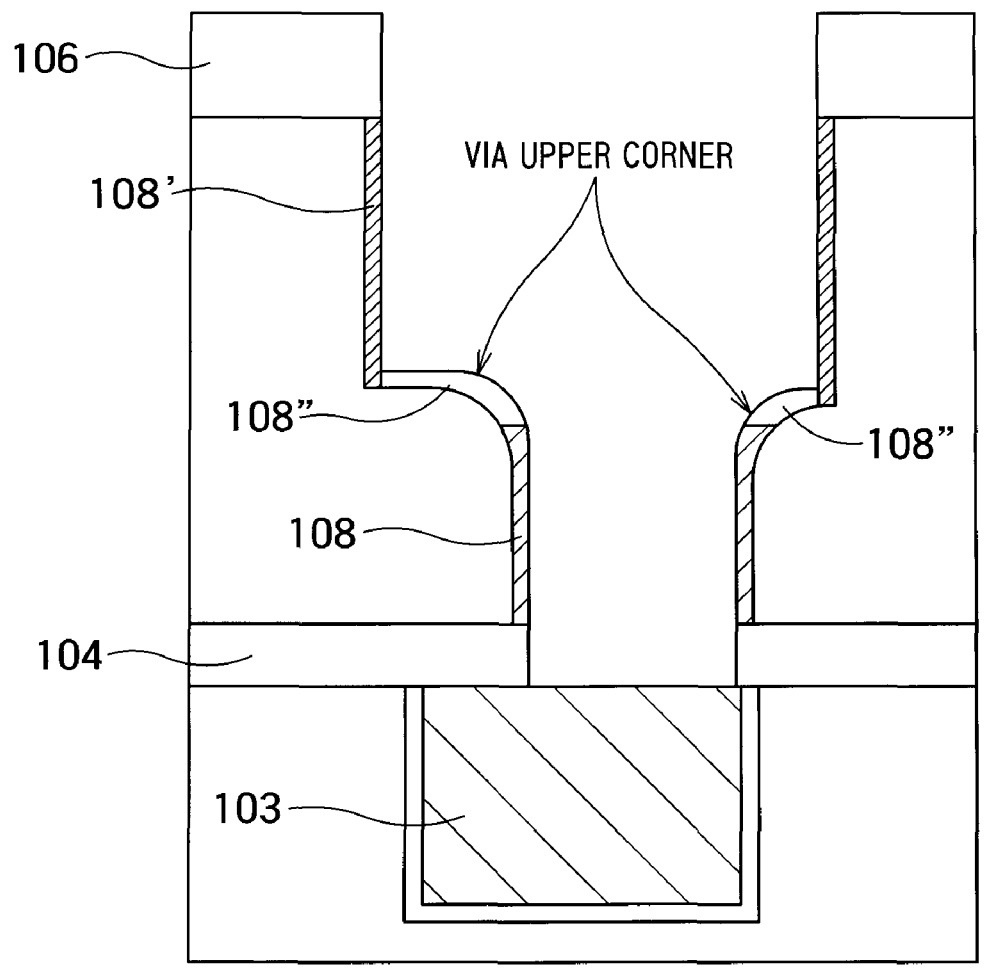
FIG. 4 is a cross-sectional view showing the process following the process shown in FIG. 3 in the dual damascene process.

FIG. 4 is a cross-sectional view showing the process following the process shown in FIG. 3 in the dual damascene process.

After the trench is formed, the remaining organic film 110 is removed by the Asher technique, and etching is performed on the diffusion preventing film (the SiCN film) 104 inside the via hole by RIE, with the TEOS film (the silicon insulating film) 106 being used as a mask. At this point, the first metal wire (the Cu single damascene wire) 103 below the via hole is exposed. The interlayer dielectric (the low-k film) 105 is exposed to a plasma atmosphere and the air or the like, and an additional SiO layer is formed on the surface of the interlayer dielectric (the low-k film) 105 inside the via hole and the trench. Particularly, since the inside of the via hole is exposed to a denser plasma atmosphere, the interlayer dielectric (the low-k) film) 105 is deformed dramatically at the upper corners of the via, and the formation of the SiO layer becomes more noticeable. The SiO layer at the upper corner portions of the via is exposed to the air, and absorbs moisture. As a result, a large damaged layer (a SiOH layer) 108" is formed.

Figure 5:
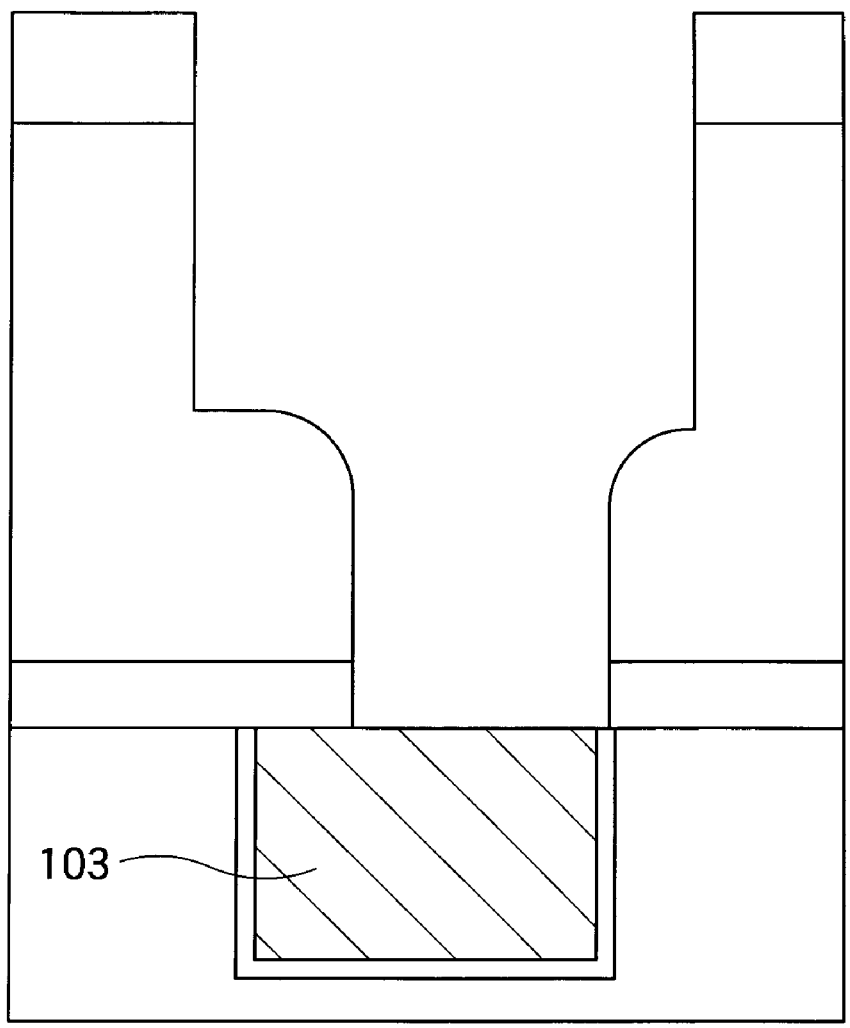
FIG. 5 is a cross-sectional view showing the process following the process shown in FIG. 4 in the dual damascene process.

FIG. 5 is a cross-sectional view showing the process following the process shown in FIG. 4 in the dual damascene process.

After etching is performed on the diffusion preventing film (the SiCN film) 104, wet etching is performed with the use of a chemical solution containing a HF-based substance, so as to perform the postprocessing of the etching and clean the Cu surface of the first metal wire (the single damascene wire) 103. Since the SiO layer and the damaged layers (SiOH layers) 108, 108', and 108" formed on the surface of the interlayer dielectric (the low-k film) 105 inside the trench and the via hole do not have tolerance to a chemical solution containing a HF-based substance, those layers are removed by the wet etching. As a result, a width of the trench (particularly, the via diameter) becomes greater by the widths of the removed SiO layer and the removed damaged layers (SiOH layer) 108, 108', and 108", and it becomes difficult to reduce the size of the semiconductor device. If the wet etching is performed with a chemical solution not containing a HF-based substance, or wet etching is not performed at all, the damaged layers (SiOH layers) 108, 108', and 108" remain to lower the reliability of the wires of the semiconductor device.

Figure 6:
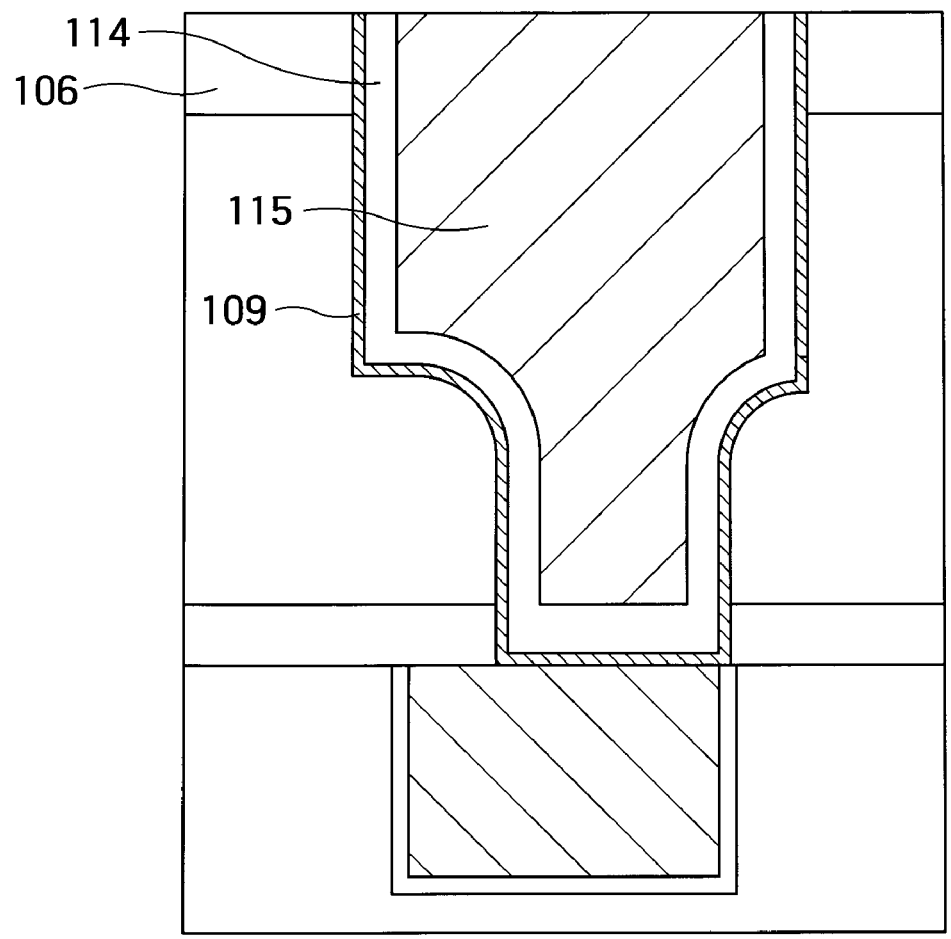
FIG. 6 is a cross-sectional view showing the process following the process shown in FIG. 5 in the dual damascene process.

FIG. 6 is a cross-sectional view showing the process following the process shown in FIG. 5 in the dual damascene process.

After the wet etching is performed, a first barrier metal 109 is formed on the entire surface including the inside of the via hole and the inside of the trench. If the damaged layers (SiOH layers) 108, 108', and 108" remain, the OH group contained in the damaged layers (SiOH layers) 108, 108', and 108" reacts with the material of the first barrier metal 109 during the high-temperature processing performed after the formation of the first barrier metal 109. As a result, a barrier metal oxide film is formed to lower the reliability of the wires.

After a seed layer 114 is formed, a wiring material (such as Cu) is formed on the entire surface of the first barrier metal 109 by a sputtering technique or a plating technique, so as to fill the via hole and the trench. To prevent short-circuiting between the trench wires, the portions of the first barrier metal 109 and the seed layer 114, and the Cu exiting outside the trench are removed by CMP. In this manner, a second metal wire (a Cu dual damascene wire) 115 is formed.

Next, an embodiment of the present invention is described, with reference to the accompanying drawings. It should be noted that the following embodiment is merely an example, and does not limit the scope of the present invention.

Embodiment 1

Referring to the accompanying drawings, Embodiment 1 of the present invention is described. In Embodiment 1 of the present invention, after a via is formed, a barrier metal is formed on the interlayer dielectric of the side walls of the via.

Referring to FIG. 1 and FIGS. 7 to 12, the dual damascene process of Embodiment 1 of the present invention is described.

First, as in the process shown in FIG. 1, an insulating film 101 is formed on a contact hole continuing to a semiconductor element, a lower-layer wiring barrier metal 102, a first metal wire (a Cu single damascene wire) 103, a diffusion preventing film (a SiCN film) 104, an interlayer dielectric (a low-k film) 105, a TEOS film (a silicon insulating film) 106, and s first resist 107 are formed. A via pattern is then formed by a photolithography technique.

The interlayer dielectric (the low-k film) 105 may be a methyl-silsesquioxane (a SiOC film), an insulating film that has Si as its skeleton and is terminated with a methyl group ($CH_3$), or an insulating film that has Si as its skeleton and is terminated with an aryl group (CH substituent group), for example. When such an insulating film is exposed to a plasma atmosphere, the methyl group ($CH_3$) or the aryl group (CH substituent group) is detached and is bonded with the oxygen in the air, to form a SiO layer. The SiO layer then absorbs moisture to form a damaged layer (s SiOH layer).

Figure 7:
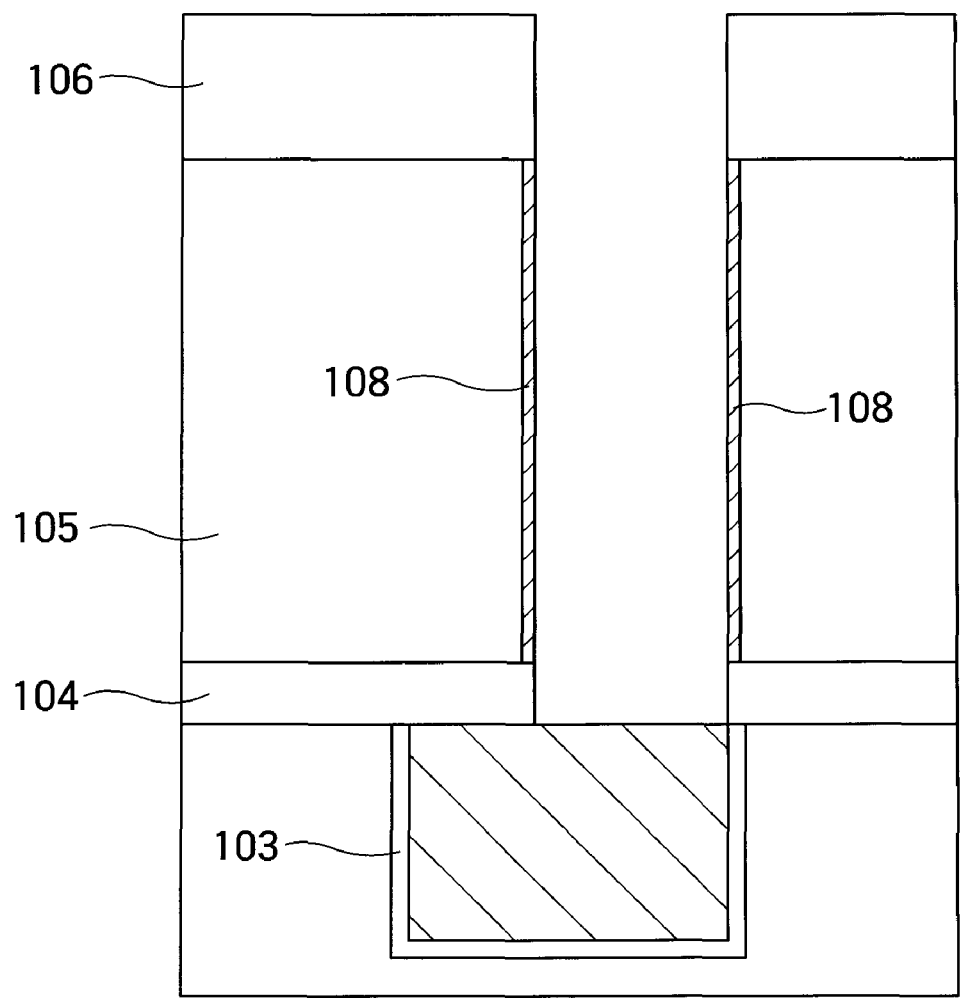
FIG. 7 is a cross-sectional view showing the process following the process shown in FIG. 1 in a dual damascene process of Embodiment 1 of the present invention.

FIG. 7 is a cross-sectional view showing the process following the process shown in FIG. 1 in the dual damascene process of Embodiment 1 of the present invention.

After a via pattern is formed by a photolithography technique, etching is performed thoroughly on the TEOS film (the silicon insulating film) 106, the interlayer dielectric (the low-k film) 105, and the diffusion preventing film (the SiCN film) 104 by RIE (so as to expose the first metal wire (the Cu single damascene wire) 103). In this manner a via hole is formed, and the first resist 107 used as a mask is removed by the Asher technique. At this point, the interlayer dielectric (the low-k film) 105 is exposed to a plasma atmosphere by RIE and the Asher technique, so as to form a SiO layer on the inner faces of the via hole. The SiO layer then absorbs moisture to form a damaged layer (a SiOH layer) 108.

Figure 8:
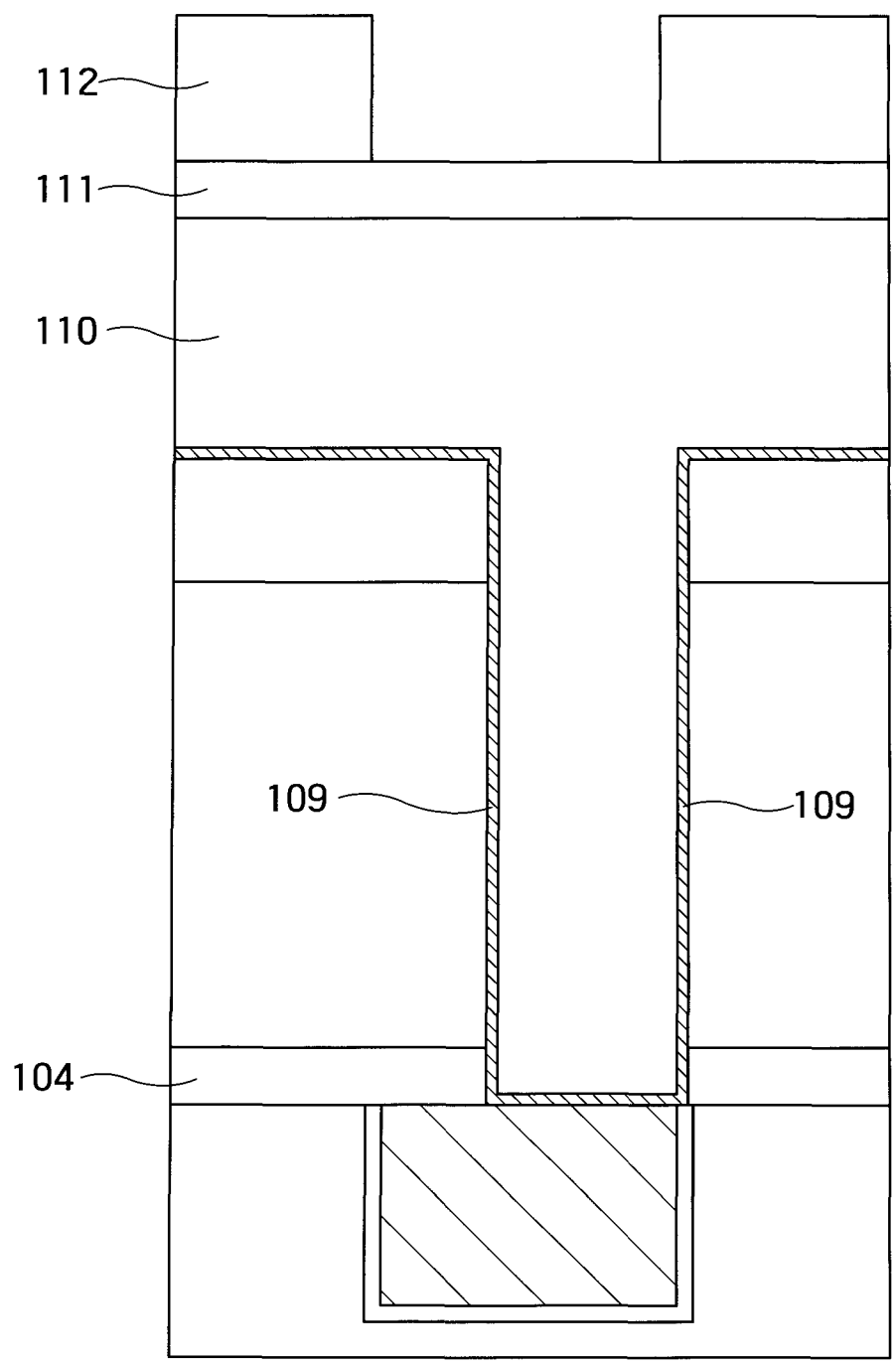
FIG. 8 is a cross-sectional view showing the process following the process shown in FIG. 7 in the dual damascene process of Embodiment 1 of the present invention.

FIG. 8 is a cross-sectional view showing the process following the process shown in FIG. 7 in the dual damascene process of Embodiment 1 of the present invention.

After the first resist 107 is removed, wet etching is performed with the use of a chemical solution containing a HF-based substance, so as to remove the damaged layer (the SiOH layer) 108.

A first barrier metal 109 is then formed on the entire surface, including the inside which is sidewalls and a bottom surface of the via hole. The material of the first barrier metal 109 is a Ti-based film, in view of easiness of processing.

Spin coating is then performed to form an organic film 110 that fills the via hole, and an inorganic film 111 is formed on the organic film 110.

A second resist 112 is next formed, and a trench pattern is formed by a photolithography technique. At this point, the first barrier metal 109 serves to shield the amine group (NH) generated from the surface of the diffusion preventing film (the SiCN film) 104. Accordingly, the above described skirt portions and the unresolved portions are not formed, and a photolithography process of an oxidation enhancing type can be properly carried out.

Figure 9:
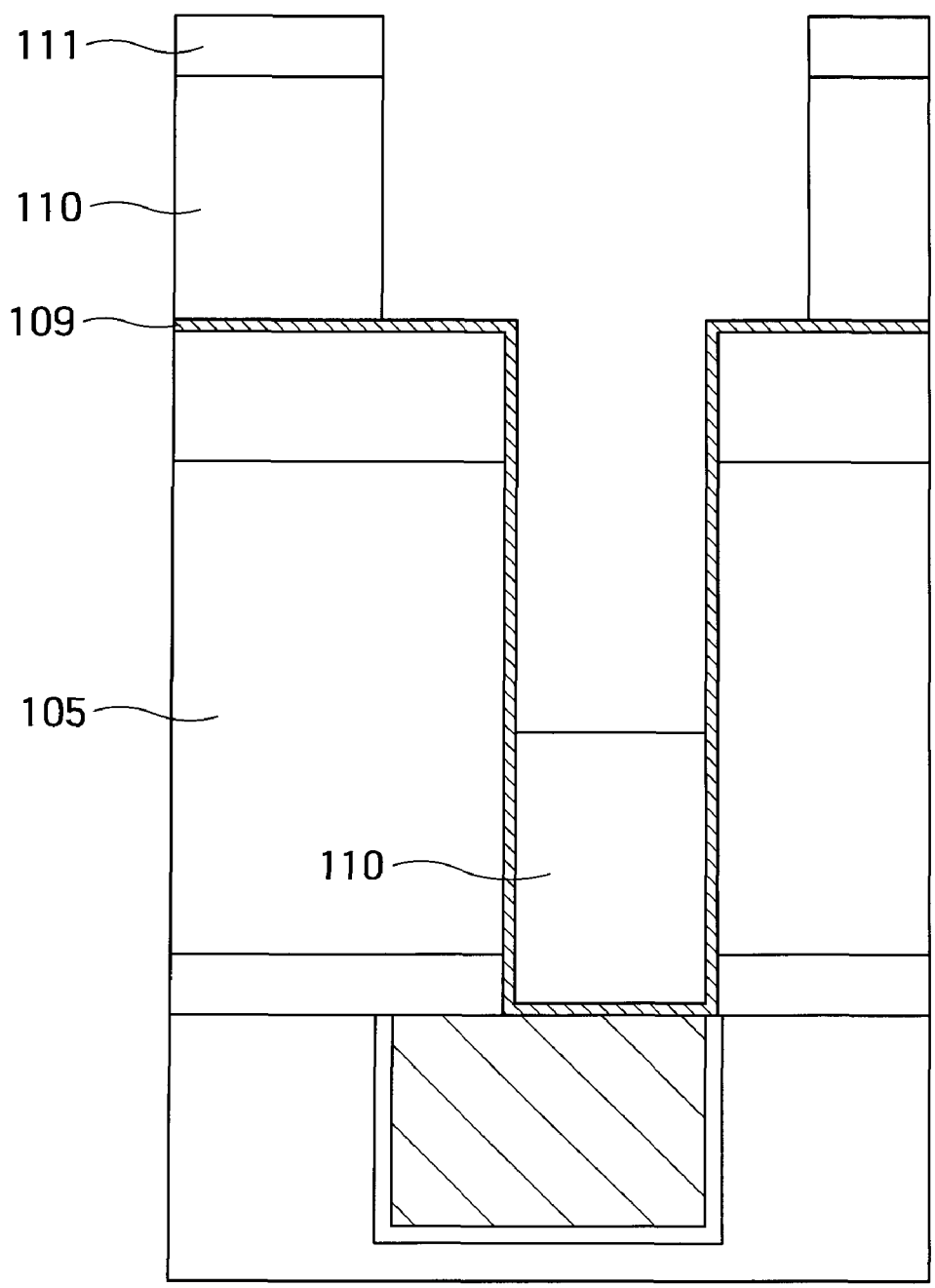
FIG. 9 is a cross-sectional view showing the process following the process shown in FIG. 8 in the dual damascene process of Embodiment 1 of the present invention.

FIG. 9 is a cross-sectional view showing the process following the process shown in FIG. 8 in the dual damascene process of Embodiment 1 of the present invention.

After the trench pattern is formed by a photolithography technique, etching is performed on the inorganic film 111 and the organic film 110 by RIE. When the etching is performed on the organic film 110 filling the via hole, selective etching is performed on the first barrier metal 109, so as to form a recess that reaches a predetermined height of the interlayer dielectric (the low-k film) 105 (so as to leave part of the organic film 110 in the via hole).

Figure 10:
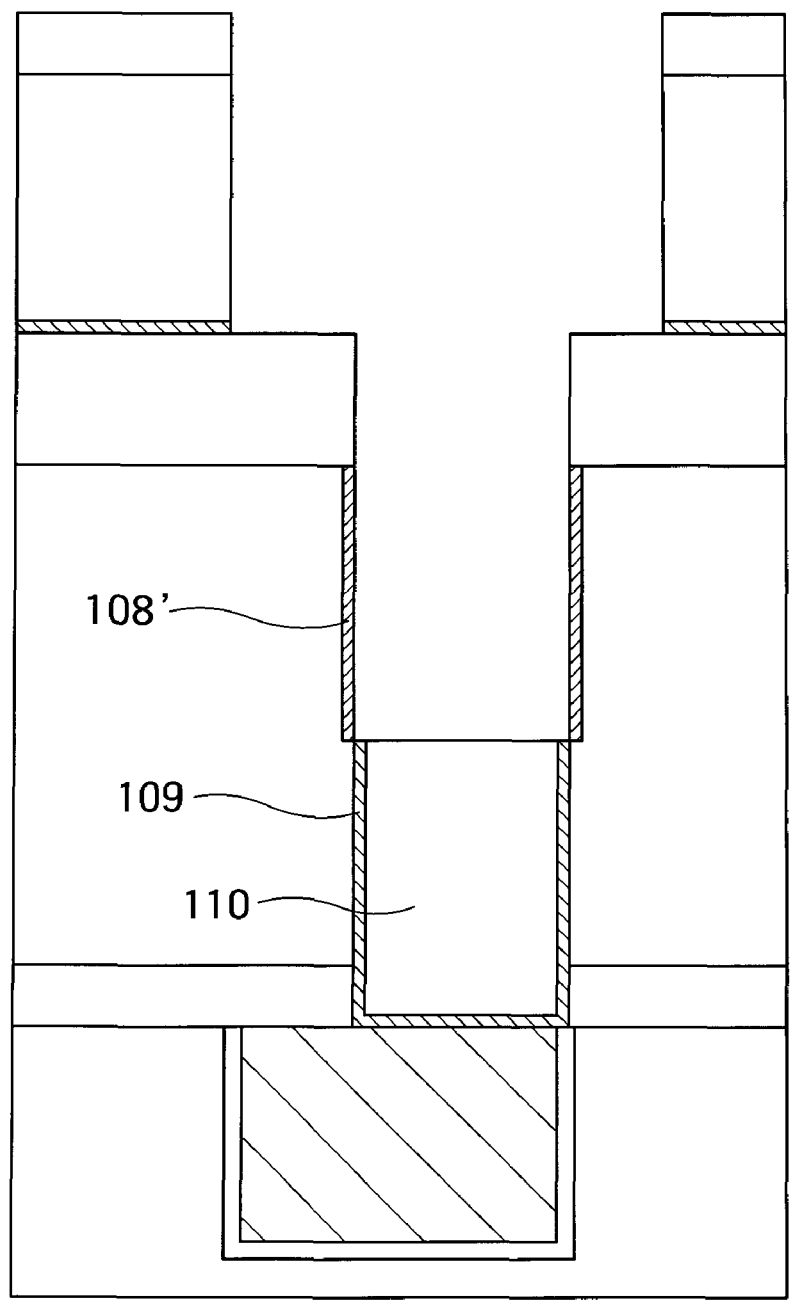
FIG. 10 is a cross-sectional view showing the process following the process shown in FIG. 9 in the dual damascene process of Embodiment 1 of the present invention.

FIG. 10 is a cross-sectional view showing the process following the process shown in FIG. 9 in the dual damascene process of Embodiment 1 of the present invention.

After the recess is formed, selective and isotropic etching is performed thoroughly on the first barrier metal 109 by RIE or chemical dry etching (CDE), with respect to the organic film 110 remaining in the via hole. Exposed to a plasma atmosphere by RIE, a SiO layer is formed on the inner faces of the via hole, and the SiO layer absorbs moisture to form another damaged layer (a SiOH layer) 108'.

Figure 11:
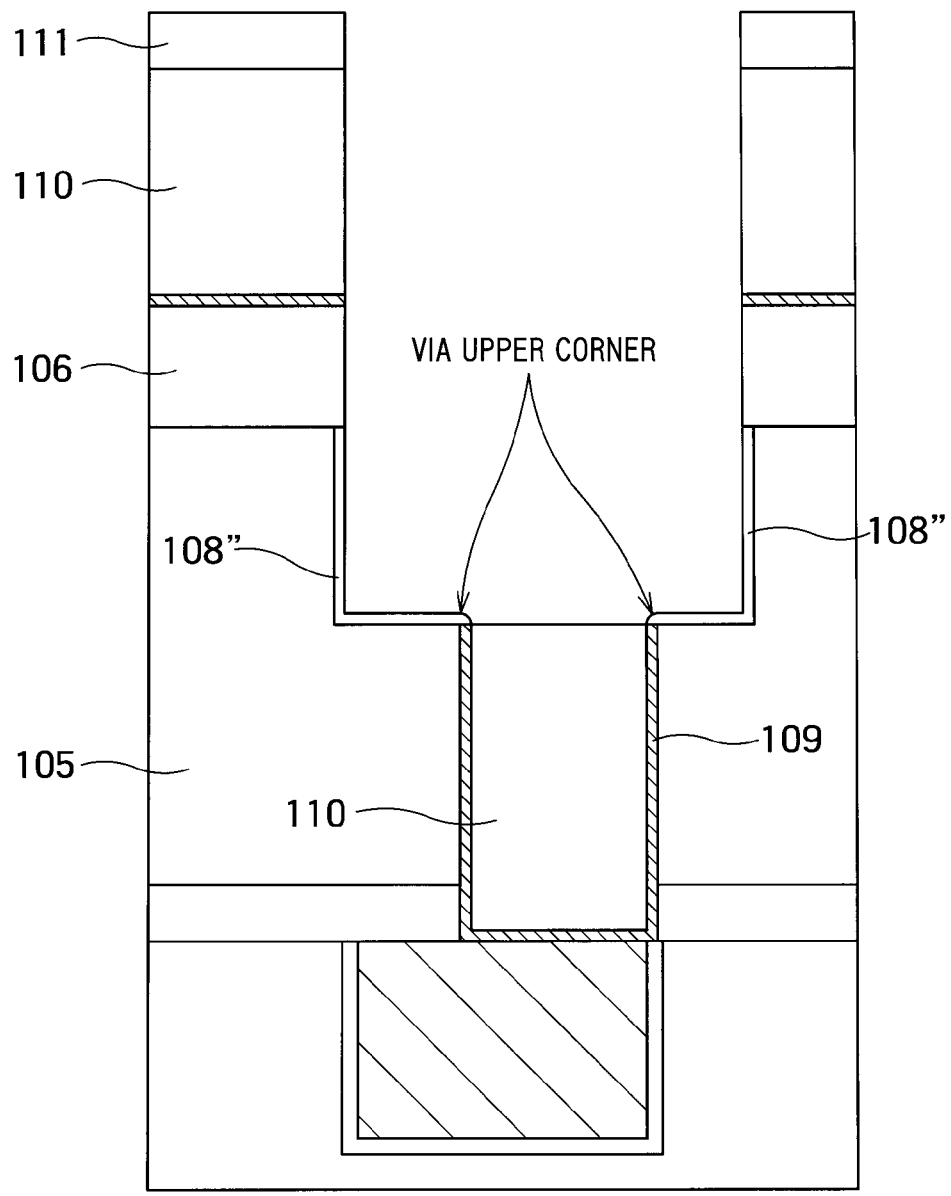
FIG. 11 is a cross-sectional view showing the process following the process shown in FIG. 10 in the dual damascene process of Embodiment 1 of the present invention.

FIG. 11 is a cross-sectional view showing the process following the process shown in FIG. 10 in the dual damascene process of Embodiment 1 of the present invention.

After the first barrier metal 109 is partially etched, half-etching is performed on the TEOS film (the silicon insulating film) 106, the interlayer dielectric (the low-k film) 105, and the damaged layer (the SiOH layer) 108' to a predetermined height (to a higher position than the first barrier metal 109 and the organic film 110 remaining in the via hole) by RIE, with the inorganic film 111 and the organic film 110 being used as masks. In this manner, another damaged layer (a SiOH layer) 108" is formed on the sidewalls of the interlayer dielectric (the low-k film) 105 as described above.

At the time of the etching of the interlayer dielectric (the low-k film) 105, half-etching is performed so that the etching is stopped at a higher position than the first barrier metal 109 remaining in the via hole. At this point, the first barrier metal 109 that is not etched serves as a shield, and the interlayer dielectric (the low-k film) 105 is not exposed to a plasma atmosphere and the air or the like. Accordingly, the via upper corners of the interlayer dielectric (the low-k film) 105 are not dramatically deformed, and the formation of a new damaged layer (a SiOH layer) on the side faces of the interlayer dielectric 105 is prevented. Thus, adverse influence on the Cu burying characteristics and the reliability of the wires can be reduced.

Figure 12:
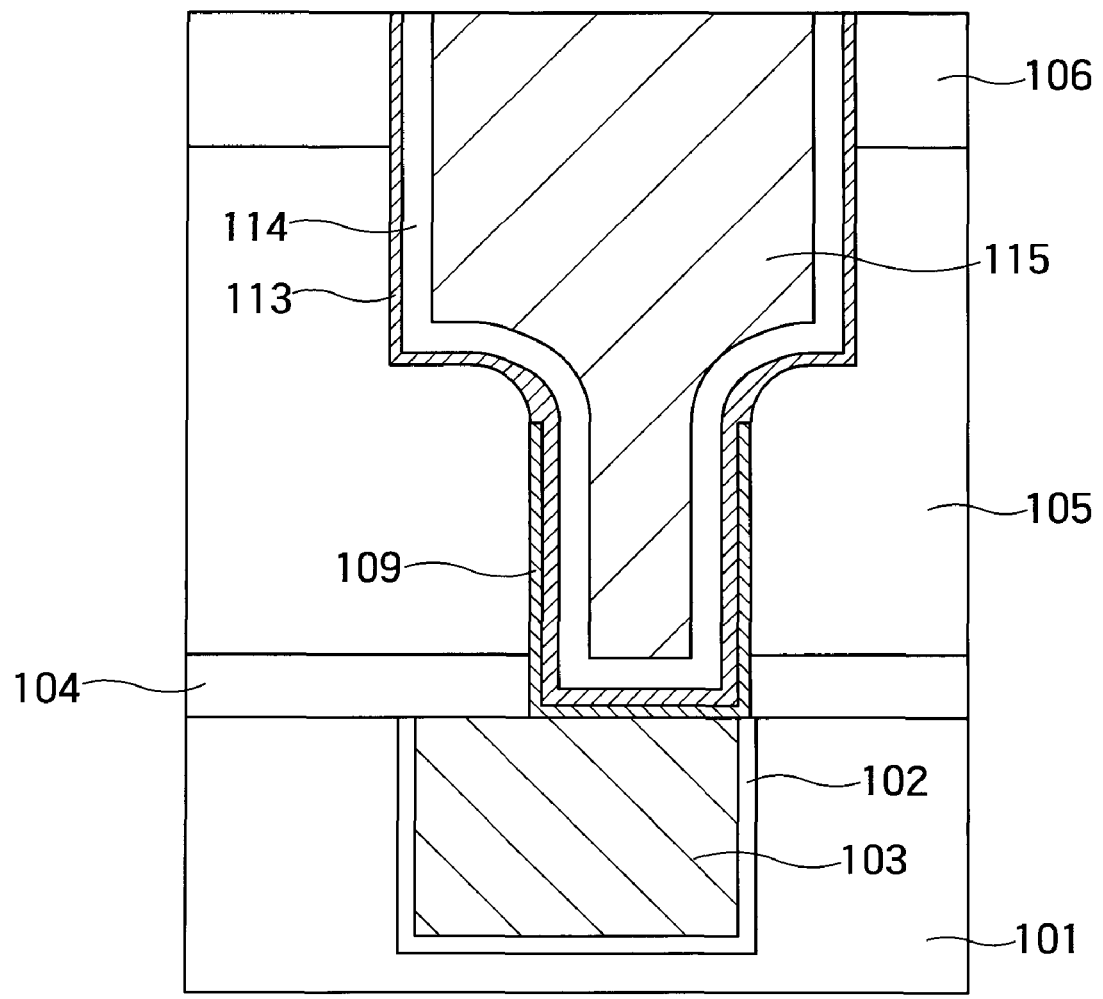
FIG. 12 is a cross-sectional view showing the process following the process shown in FIG. 11 in the dual damascene process of Embodiment 1 of the present invention.

FIG. 12 is a cross-sectional view showing the process following the process shown in FIG. 11 in the dual damascene process of Embodiment 1 of the present invention.

After etching is performed on the TEOS film (the silicon insulating film) 106, the interlayer dielectric (the low-k film) 105, and the damaged layer (the SiOH layer) 108', etching is performed on the first barrier metal 109. To remove the damaged layer (the SiOH layer) 108", wet etching is performed with the use of a chemical solution containing a HF-based substance.

The remaining organic film 110 is then removed by the Asher technique. In the dual damascene process of Embodiment 1 of the present invention, the first barrier metal 109 serves as a shield, and the interlayer dielectric (the low-k film) 105 is not exposed to a plasma atmosphere and the air or the like. Accordingly, a new damaged layer (a SiOH layer) is not formed on the sidewalls of the via hole during the Asher process. Also, in the dual damascene process of Embodiment 1 of the present invention, the diffusion preventing film (the SiCN film) 104 does not need etching, and the shapes of the via upper corners can be maintained as they are formed when the via hole is processed.

A second barrier metal 113 is formed on the entire surface, including the inside of the via hole and the inside of the trench. In a conventional dual damascene process, it becomes more difficult to form a barrier metal uniformly on a surface including the inside of the via hole in a dual damascene structure having a complicated shape, as the structure becomes smaller. In the dual damascene process of Embodiment 1 of the present invention, however, the first barrier metal 109 already exists inside the via hole at this point. Therefore, it is not necessary to uniformly form the second barrier metal 113, and the formation of the second barrier metal 113 is easier.

After a seed layer 114 is formed on the entire surface including the upper face of the second barrier metal 113, Cu is formed on the entire surface of the seed layer 114 by a sputtering technique or a plating technique, so as to fill the via hole and the trench. To prevent short-circuiting between the trench wires, the portions of the second barrier metal 113, the seed layer 114, and the Cu existing outside the trench are removed by CMP, so as to form a second metal wire (a Cu dual damascene wire) 115.

Figure 13:
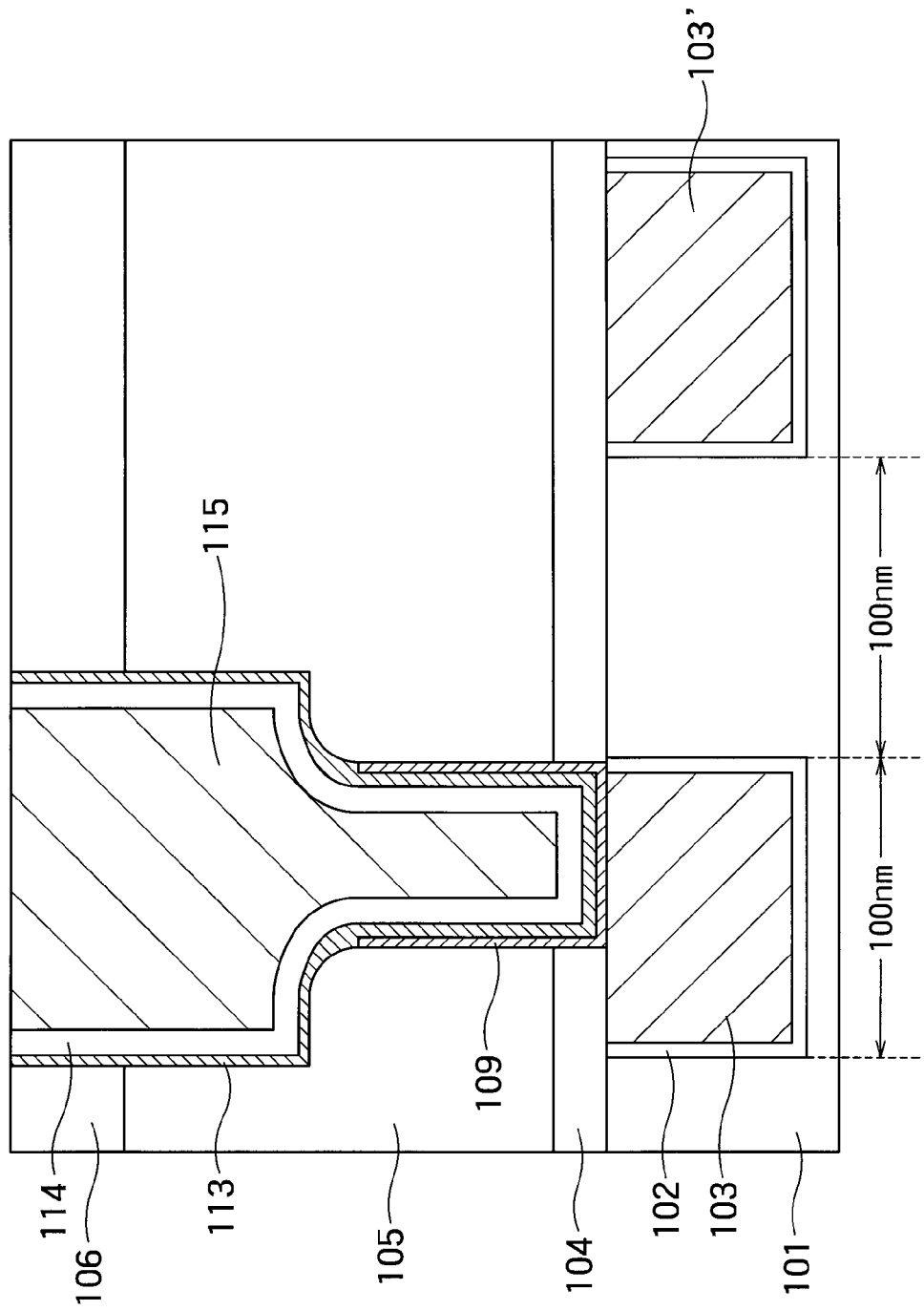
FIG. 13 is a schematic cross-sectional view of a semiconductor device that is manufactured by the dual damascene process of Embodiment 1 of the present invention.

FIG. 13 is a schematic cross-sectional view of a semiconductor device that is manufactured by the dual damascene process of Embodiment 1 of the present invention.

In this semiconductor device, the first metal wire (the Cu single damascene wire) 103 connected to the second metal wire (the Cu dual damascene wire) 115 is located at a distance of approximately 100 nm from an unconnected wire 103' that is not connected to the second metal wire (the Cu dual damascene wire) 115. The width of each of the first metal wire (the Cu single damascene wire) 103 and the unconnected wire 103' is approximately 100 nm.

In a case where the damaged layers (SiOH layers) are removed to increase a reliability of the wire as described above, the via diameter becomes larger, and the distance between the second metal wire (the Cu dual damascene wire) 115 and the unconnected wire 103' becomes shorter. For example, in a case where the via diameter increases 70 nm, the distance between the second metal wire (the Cu dual damascene wire) 115 and the unconnected wire 103' becomes 30 nm.

To avoid current leakage, a certain distance or longer needs to be maintained between the second metal wire (the Cu dual damascene wire) 115 and the unconnected wire 103'. On the other hands, to reduce the size of the semiconductor device, the distance between the first metal wire (the Cu single damascene wire) 103 and the unconnected wire 103' needs to be made shorter. Accordingly, to manufacture a small-sized semiconductor device having high reliability, it is necessary not only to increase the processing precision in the dual damascene process, but also to prevent an increase in the via diameter.

As shown in FIG. 13, the semiconductor device in accordance with Embodiment 1 of the present invention includes the insulating film 101 formed on a semiconductor substrate, the first metal wire 103 formed in the insulating film 101, the interlayer dielectric (the low-k film) 105 formed on the insulating film 101, the second metal wire 115 formed in the interlayer dielectric (the low-k film) 105, the first barrier metal 109 formed on side walls and a bottom surface of the via hole to be located between the second metal wire 115 and the interlayer dielectric (the low-k film) 105, and the second barrier metal 113 formed on the first barrier metal 109 and side walls of the trench in the via hole.

The seed layer 114 is formed between the second metal wire 115 and the first and second barrier metals 109 and 113. The first barrier metal 109 is formed below the second metal wire 115, and is in contact with the first metal wire 103. The second barrier metal 113 is located between the seed layer 114 and the interlayer dielectric (the low-k film) 113.

In Embodiment 1 of the present invention, the first barrier metal 109 and the second barrier metal 113 are formed on the sidewalls of the interlayer dielectric (the low-k film) 105. Accordingly, plasma damage to the interlayer dielectric (the low-k film) 105 due to RIE or the Asher process can be prevented, and a damaged layer (a SiOH layer) is not formed on the sidewalls of the interlayer dielectric (the low-k film) 105. As a result, an increase in the via diameter can be reduced, and a reliability of the wire can be increased. Particularly, as the dielectric constant of the interlayer dielectric (the low-k film) 105 becomes smaller, the effects of Embodiment 1 of the present invention become more remarkable.

Also, since the first barrier metal 109 is formed on the entire surface including the inside of the via hole in Embodiment 1 of the present invention, the amine group (NH) generated from the diffusion preventing film (the SiCN film) 104 and the interlayer dielectric (the low-k film) 105 can be restrained, and a photolithography process of an oxidation enhancing type can be properly carried out.

Also, since the first barrier metal 109 is formed on the surface of the first metal wire (the Cu single damascene wire) 103 in Embodiment 1 of the present invention, a via hole can be formed to expose the first metal wire (the Cu single damascene wire) 103, and the formation of the via hole is easier.

What is claimed is:

1. A method for manufacturing a semiconductor device, comprising:
    forming a first metal wire in a groove formed in an insulating film on a semiconductor substrate;
    forming an interlayer dielectric on the insulating film and the first metal wire;
    forming a via hole by etching the interlayer dielectric;
    forming a first barrier metal on sidewalls of the via hole;
    forming an organic film in the via hole having the first barrier metal formed therein;
    etching the first barrier metal exposed by performing an etchback on the organic film to a predetermined position;
    forming a trench integrally with an upper portion of the via hole by etching the interlayer dielectric to a predetermined position;
    forming a second barrier metal on the first barrier metal and sidewalls of the trench in the via hole, after the organic film remaining in the via hole is removed; and
    forming a second metal wire in the via hole and the trench having the second barrier metal formed therein.

2. The method according to claim 1, wherein the forming the via hole includes etching the interlayer dielectric so as to expose the first metal wire.

3. The method according to claim 1, wherein the forming the trench includes etching the interlayer dielectric to a higher position than the first barrier metal and the organic film remaining after the etching of the first barrier metal.

4. The method according to claim 1, wherein the forming the interlayer dielectric includes forming a methyl silsesquioxane film, an insulating film that has Si as a skeleton and is terminated with a methyl group, or an insulating film that has Si as a skeleton and is terminated with an aryl group.

5. The method according to claim 1, wherein the forming the first barrier metal includes forming the first barrier metal on sidewalls of the via hole, after a damaged layer formed on the sidewalls is removed from the sidewalls.

6. The method according to claim 2, wherein the forming the trench includes etching the interlayer dielectric to a higher position than the first barrier metal and the organic film remaining after the etching of the first barrier metal.

7. The method according to claim 2, wherein the forming the interlayer dielectric includes forming a methyl silsesquioxane film, an insulating film that has Si as a skeleton and is terminated with a methyl group, or an insulating film that has Si as a skeleton and is terminated with an aryl group.

8. The method according to claim 2, wherein the forming the first barrier metal includes forming the first barrier metal on sidewalls of the via hole, after a damaged layer formed on the sidewalls is removed from the sidewalls.

9. The method according to claim 3, wherein the forming the interlayer dielectric includes forming a methyl silsesquioxane film, an insulating film that has Si as a skeleton and is terminated with a methyl group, or an insulating film that has Si as a skeleton and is terminated with an aryl group.

10. The method according to claim 3, wherein the forming the first barrier metal includes forming the first barrier metal on sidewalls of the via hole, after a damaged layer formed on the sidewalls is removed from the sidewalls.

11. The method according to claim 4, wherein the forming the first barrier metal includes forming the first barrier metal on sidewalls of the via hole, after a damaged layer formed on the sidewalls is removed from the sidewalls.

* * * * *